US 8,772,852 B2

(12) United States Patent
Kim et al.

(10) Patent No.: US 8,772,852 B2
(45) Date of Patent: Jul. 8, 2014

(54) NONVOLATILE MEMORY DEVICES INCLUDING COMMON SOURCE

(75) Inventors: Hong-Soo Kim, Gyeonggi-do (KR); Keon-Soo Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 582 days.

(21) Appl. No.: 12/328,141

(22) Filed: Dec. 4, 2008

(65) Prior Publication Data

US 2009/0146207 A1  Jun. 11, 2009

(30) Foreign Application Priority Data

Dec. 5, 2007  (KR) .......................... 10-2007-125547

(51) Int. Cl.
*H01L 29/788* (2006.01)

(52) U.S. Cl.
USPC ........... 257/315; 257/261; 257/300; 257/311; 257/314; 257/316; 257/E21.21; 257/E21.422; 257/E21.662; 257/E21.679; 257/E21.681; 438/201; 438/211; 438/257; 438/264; 438/279; 438/283; 438/593; 438/594; 365/185.02; 365/185.05; 365/185.08; 365/185.17

(58) Field of Classification Search
USPC .................. 257/261, 300, 311, 314–316, 250, 257/E21.18, E21.21, E21.422, E21.662, 257/E21.663, E21.665, E21.679, E21.68, 257/E21.681, E29.129, E29.3, E29.301, 257/E29.316; 365/185.02, 185.05–185.08, 365/185.17; 438/201, 211, 257, 264, 279, 438/283, 593, 594, FOR. 203
See application file for complete search history.

(56) References Cited

U.S. PATENT DOCUMENTS

| 5,696,717 | A | 12/1997 | Koh |
| 5,847,999 | A | 12/1998 | Kwon |
| 5,923,587 | A | * | 7/1999 | Choi ........................ 365/185.11 |
| 6,995,424 | B2 | 2/2006 | Lee |
| 7,388,778 | B2 | 6/2008 | Hwang |
| 7,410,870 | B2 | 8/2008 | Kim et al. |
| 2003/0151084 | A1 | 8/2003 | Lee et al. |
| 2004/0178456 | A1 | 9/2004 | Park et al. |
| 2006/0072358 | A1 | 4/2006 | Kang et al. |
| 2006/0239083 | A1* | 10/2006 | Lee .......................... 365/185.28 |
| 2006/0289944 | A1 | 12/2006 | Lee et al. |
| 2008/0002471 | A1 | 1/2008 | Lee |
| 2008/0130367 | A1 | 6/2008 | Kang et al. |
| 2008/0164509 | A1 | 7/2008 | Lee et al. |

FOREIGN PATENT DOCUMENTS

| KR | 1020000004481 A | 1/2000 |
| KR | 1020010065173 A | 7/2001 |
| KR | 1020030042490 A | 6/2003 |
| KR | 1020030078207 A | 10/2003 |
| KR | 20060112166 A | 10/2006 |

* cited by examiner

*Primary Examiner* — Meiya Li
(74) *Attorney, Agent, or Firm* — Myers Bigel Sibley & Sajovec, PA

(57) ABSTRACT

Provided is a nonvolatile memory device including a common source. The device includes a first active region crossing a second active region, a common source disposed in the second active region, and a source conductive line disposed on the common source in parallel to the common source. The source conductive line is electrically connected to the common source.

24 Claims, 17 Drawing Sheets

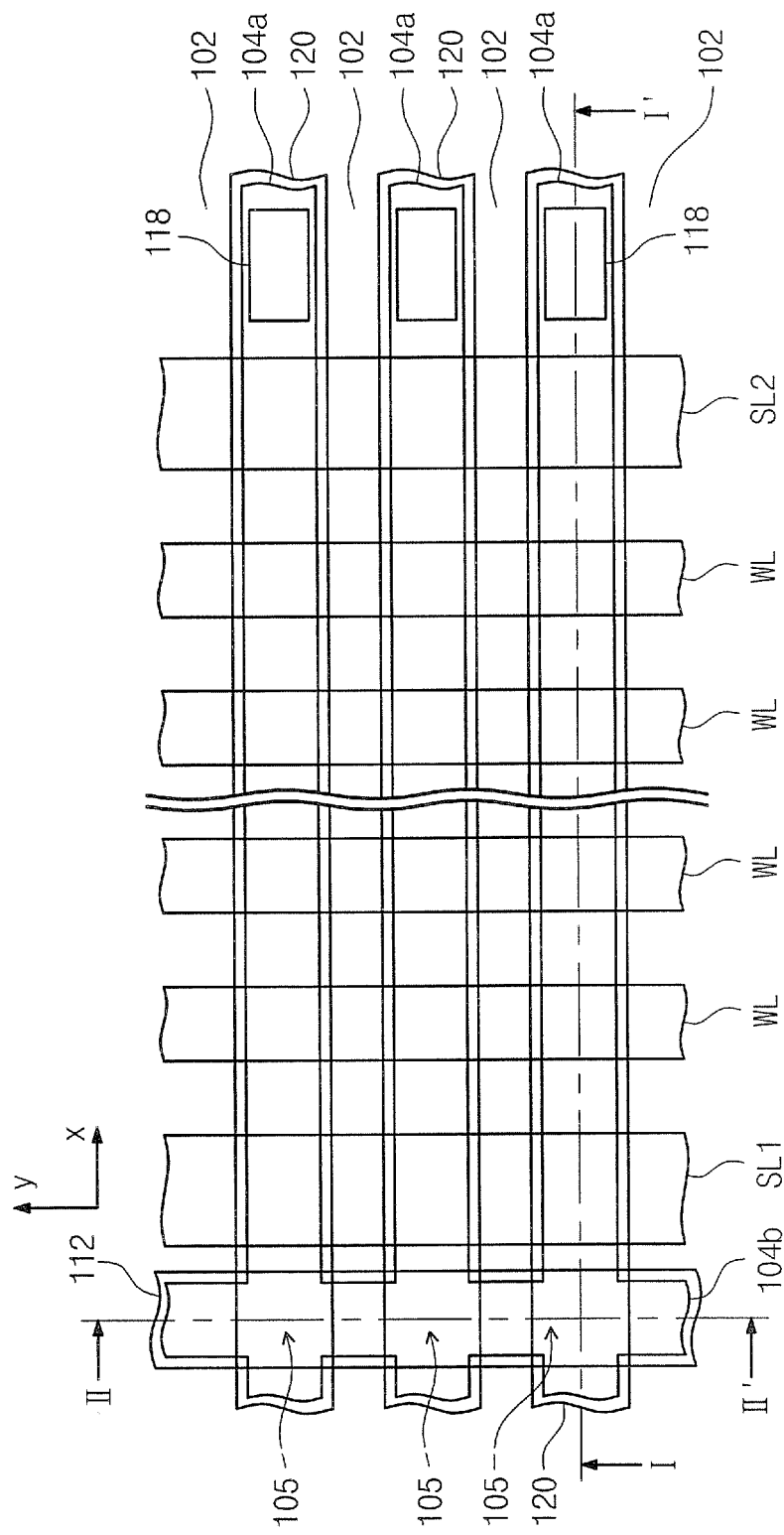

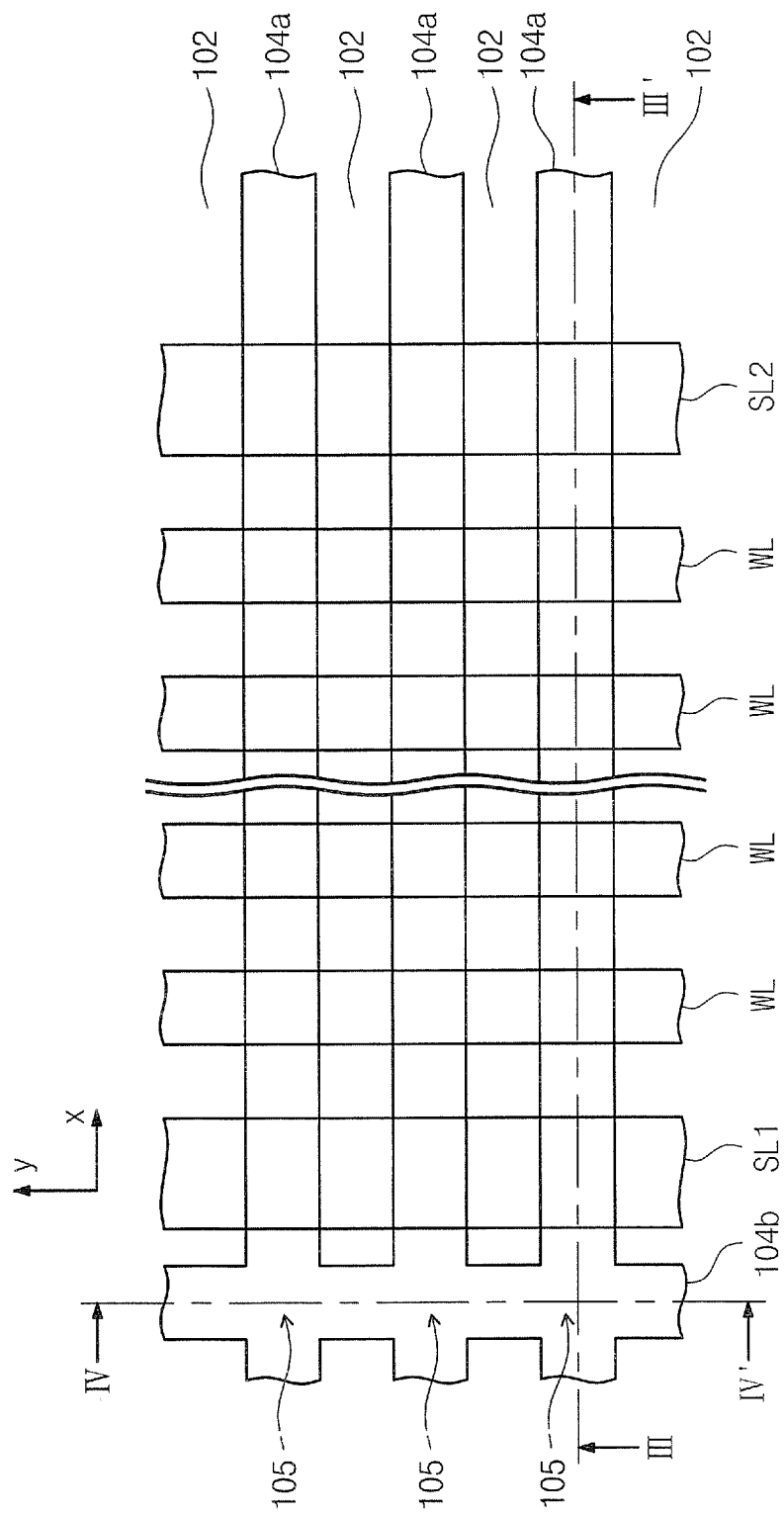

US 8,772,852 B2

NONVOLATILE MEMORY DEVICES INCLUDING COMMON SOURCE

REFERENCE TO PRIORITY APPLICATION

This U.S. patent application claims priority to Korean Patent Application No. 2007-0125547, filed Dec. 5, 2007, the entire contents of which are hereby incorporated herein by reference.

BACKGROUND

Exemplary embodiments disclosed herein relates to a semiconductor device, and more particularly, to a nonvolatile memory device including a common source.

Nonvolatile memory devices maintain stored data even when an external power supply is interrupted. Nonvolatile memory devices may include a MASK ROM device, a FRAM device, an EEPROM device, a phase change memory device, a magnetic memory device and/or a flash memory device. The MASK ROM device may be manufactured by coding data during a manufacturing process. Thus, it may be impossible to change data stored in the MASK ROM device. The FRAM device may use a ferroelectric as an element storing data and the phase change memory device may use a phase change material having two stable states as an element storing data. The magnetic memory device may include a data storing element using magnetic moment. The flash memory device may include a charge storing element which is electrically isolated.

A NAND-type flash memory device among the flash memory devices may be highly integrated. Therefore, the NAND-type flash memory device is in the limelight as a mass storage device. Recently, a study of replacing a hard disc by a NAND-type flash memory device has been actively performed.

As a semiconductor industry is developed to a high degree, a nonvolatile memory device is more highly integrated. Thus, it becomes difficult more and more to manufacture a nonvolatile memory device. For instance, a margin of a manufacturing process is reduced and new defects occur to deteriorate a characteristic of a nonvolatile memory device. A lot of studies for overcoming these difficulties have been performing.

SUMMARY

Some exemplary embodiments provide a nonvolatile memory device. The nonvolatile memory device may include a device isolation pattern formed in a substrate, the device isolation pattern defining a plurality of first active regions which extends in parallel to each other along a first direction and a second active region which extends along a second direction perpendicular to the first direction and crosses the plurality of the first active regions; a common source formed in the second active region and extends along the second direction; a plurality of common drains formed in the plurality of the first active regions, respectively; a first selection line, a plurality of word lines and a second selection line crossing the first active regions disposed between the common source and the common drains in parallel to each other; and a source conductive line disposed on the second active region, the source conductive line extending along the second direction and being electrically connected to the common source.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 1a is a top plan view of a nonvolatile memory device according to an embodiment of the present invention.

FIG. 1b is a cross-sectional view taken along the line I-I' of FIG. 1a.

FIG. 1c is a cross-sectional view taken along the line II-II' of FIG. 1a.

FIGS. 2a and 3a are top plan views illustrating a method of forming a nonvolatile memory device according to an embodiment of the present invention.

FIG. 4b is a cross-sectional view taken along the line V-V' of FIG. 4a.

FIG. 4c is a cross-sectional view taken along the line VI-VI' of FIG. 4a.

FIG. 5b is a cross-sectional view taken along the line VII-VII' of FIG. 5a.

FIG. 5c is a cross-sectional view taken along the line VIII-VIII' of FIG. 5a.

DETAILED DESCRIPTION OF PREFERRED EMBODIMENTS

Figure 1B:
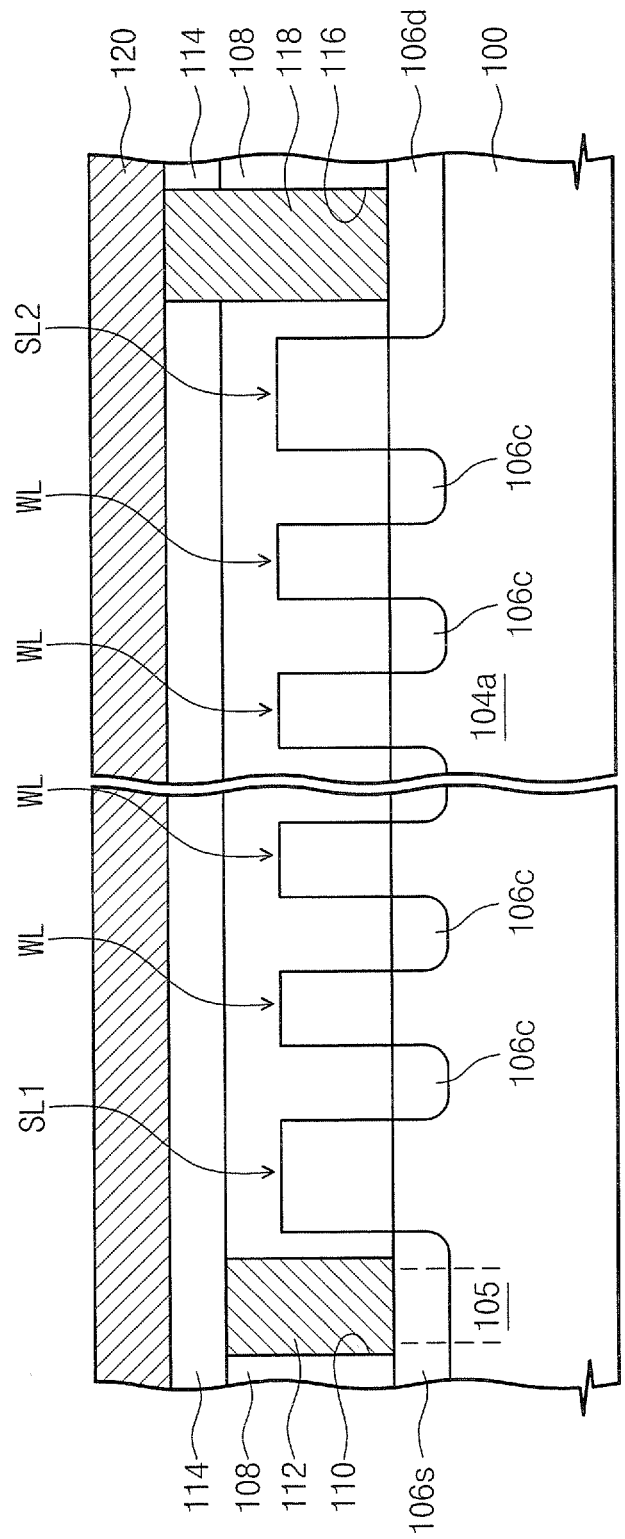

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

Figure 1C:
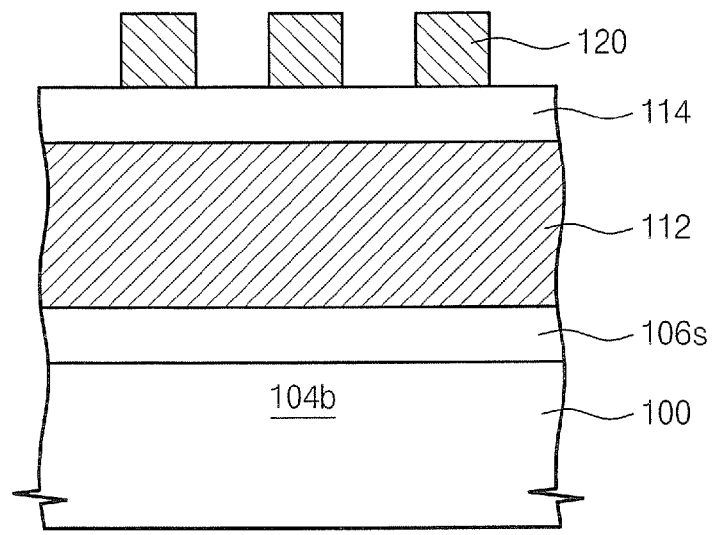

FIG. 1a is a top plan view of a nonvolatile memory device according to an embodiment of the present invention and FIG. 1b is a cross-sectional view taken along the line I-I' of FIG. 1a. FIG. 1c is a cross-sectional view taken along the line II-II' of FIG. 1a.

Referring to FIGS. 1a, 1b and 1c, a device isolation pattern 102 defining first active regions 104a and a second active region 104b is disposed in a semiconductor substrate 100 (hereinafter, referred to as substrate). A plurality of the first active regions 104a extends in parallel to each other along a first direction. The first active regions 104a may be disposed at regular intervals. The first active regions 104a may be a line shape. The second active region 104b extends along a second direction perpendicular to the first direction, and crosses the plurality of the first active regions 104a. The second active region 104b may also be a line shape.

The first direction corresponds to an x axis direction of FIG. 1a and the second direction corresponds to a y axis direction of FIG. 1a. Also, the first direction may correspond to a longitudinal direction of the first active region 104a, and the second direction may correspond to a longitudinal direction of the second active region 104b. The first and second directions are parallel to a top surface of the substrate 100.

A plurality of crossing regions 105, where the first and second active regions 104a and 104b cross each other, are arranged in one row along the second direction. Each of the crossing regions 105 is included to the second active region 104b and is also included to the first active region 104a. The first and second active regions 104a and 104b correspond to a part of the substrate 100 surrounded by the device isolation pattern 102. The substrate 100 may be a silicon substrate, a germanium substrate or a silicon-germanium substrate.

A common source 106s is formed in the second active region 104b. The common source 106s extends along the second direction. That is, the common source 106s extends along a lengthwise direction of the second active region 104b. The common source 106s passes through the plurality of crossing regions 105. A plurality of common drains 106d is disposed in the plurality of the first active regions 104a, respectively. The common drains 106d are spaced apart from the common source 106s in the first direction. The common drains 106d are spaced from each other in the second direction. The common drains 106d may be disposed along one row. Although it is not shown, the plurality of common drains 106d may be disposed in a zigzag shape along the second direction. The common source 106s and the common drains 106d are doped with same type dopants.

A first selection line (SL1) and a second selection line (SL2) cross the first active regions 104a disposed between the common source 106s and the common drains 106d. A plurality of word lines (WL) crosses the first active regions 104a disposed between the first selection line (SL1) and the second selection line (SL2) in parallel to each other. The selection lines (SL1, SL2) and the word lines (WL) extend in the second direction and are disposed in parallel to each other. Cell source/drain 106c are disposed in the first active regions 104a of both sides of each of the word lines (WL). The cell source/drain 106c may be doped with the same type dopant as the common source and drains (106s, 106d).

A cell string is formed at each of the first active regions 104a. The cell string includes a first selection transistor, a plurality of nonvolatile memory cells serially connected to each other and a second selection transistor. A plurality of cell strings is formed at the plurality of first active regions 104a, respectively. The first selection transistor includes the first selection line (SL1), and the common source 106s and a cell drain 106c respectively disposed on both sides of the first selection line (SL1). The second selection transistor includes the second selection line (SL2), and the common drain 106d and a cell source 106c respectively disposed on both sides of the second selection line (SL2). Sources of the first selection transistors respectively included in the plurality of cell strings are connected to each other by a source conductive line 112 and the common source 106s formed in the second active region 104b.

The first selection line (SL1) may include a first gate insulating layer and a first selection gate electrode that are sequentially stacked. The second selection line (SL2) may include a second gate insulating layer and a second selection gate electrode that are sequentially stacked. The first and second gate insulating layers may be formed of a same material. The first and second selection gate electrodes may be formed of a same material.

The first selection line (SL1) is adjacent to the common source 106s and the second selection line (SL2) is adjacent to the common drains 106d. The first selection line (SL1) corresponds to a ground selection line and the second selection line (SL2) corresponds to a string selection line. The first selection line (SL1) and the second active region 104b may be spaced apart from each other in the first direction. In this case, the common source 106s extends to the first active region 104a disposed between the second active region 104b and the first selection line (SL1).

The source conductive line 112 is disposed on the common source 106s. The source conductive line 112 extends along the second direction and is electrically connected to the common source 106s. The source conductive line 112 may be formed of a material having resistivity lower than that of the common source 106s. For instance, the source conductive line 112 may include at least one selected from a group consisting of a metal (ex: tungsten, copper, aluminum, etc), a conductive metal nitride (ex: nitride titanium or nitride tantalum, etc), a metal silicide (ex: a tungsten silicide, a titanium silicide, etc) and a doped semiconductor. If the source conductive line 112 includes only a doped semiconductor, a dopant concentration of the source conductive line 112 may be higher than a dopant concentration of the common source 106s.

A mold insulating layer 108 covers an entire surface of the substrate 100. The mold insulating layer 108 may include a source groove 110. The source groove 110 penetrates the mold insulating layer 108 to expose the common source 106s and extends along the second direction. The source conductive line 112 is disposed in the source groove 110 and may be directly connected to the common source 106s. That is, the common source 106s extends along the second direction and the source conductive line 112 also extends along the second direction, so that the source conductive line 112 may be connected to a top surface of the extended common source 106s. The source conductive line 112 may include a top surface which makes a coplanar with a top surface of the mold insulating layer 108.

As shown in FIG. 1a, a width of the source conductive line 112 may be greater than a width of the second active region 104b. Alternatively, a width of the source conductive line 112 may be smaller than a width of the second active region 104b.

An insulating interlayer 114 is disposed on the source conductive line 112 and the mold insulating layer 108. A plurality of bit line plugs 118 penetrate the insulating interlayer 114 and the mold insulating layer 108, so that the bit line plugs 118 are connected to a plurality of the common drains 106d, respectively. The plurality of bit line plugs 118 respectively fills bit line holes 116 successively penetrating the insulating interlayer 114 and the mold insulating layer 108. The bit line plugs 118 may be arranged in one row along the second direction. Alternatively, in the case that the common drains 106d are disposed to be a zigzag shape along the second direction, the bit line plugs 118 may be disposed to be a zigzag shape along the second direction. A plurality of bit lines 120 is disposed on the insulating interlayer 114 in parallel to each other along the first direction. The plurality of bit lines 120 are connected to the plurality of bit line plugs 118, respectively. The bit lines 120 may cover the first active regions 104a, respectively.

Each of the bit lines 120 and each of the bit line plugs 118 combined with each other may be one body. Alternatively, an interface may exist between each of the bit lines 120 and each of the bit line plugs 118 combined with each other. The bit line plugs 118 may include at least one selected from a group consisting of a metal (ex: titanium, tantalum, or tungsten), a conductive metal nitride (ex: nitride titanium or nitride tantalum), a metal silicide (ex: a tungsten silicide or a titanium silicide) and a doped semiconductor. The bit lines 120 may include at least one selected from a group consisting of a metal (ex: titanium, tantalum, or tungsten), a conductive metal nitride (ex: nitride titanium or nitride tantalum), a metal silicide (ex: a tungsten silicide or a titanium silicide) and a doped semiconductor. The bit lines 120 and the bit line plugs 118 may include a same conductive material. Alternatively, the bit lines 120 and the bit line plugs 118 may include a different conductive material.

Figure 1D:
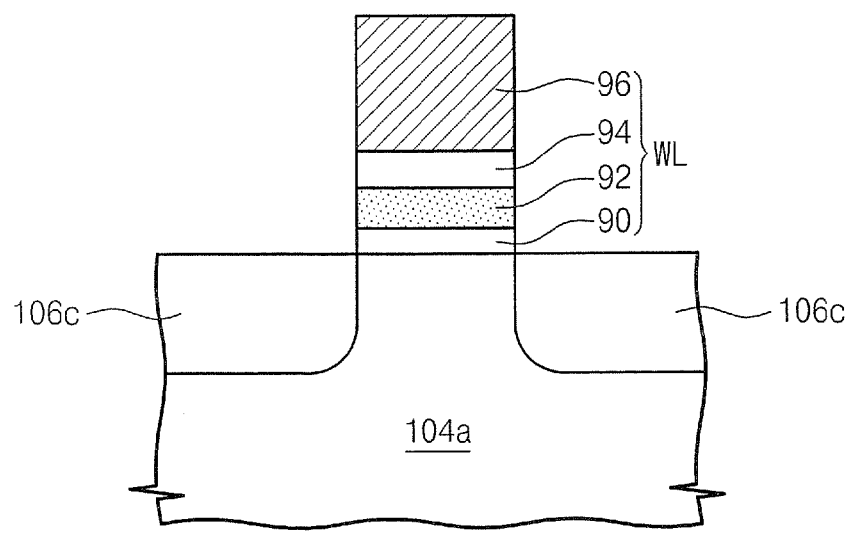
FIG. 1d is an enlarged cross-sectional view illustrating a unit cell of a nonvolatile memory device shown in FIGS. 1a, 1b and 1c.

An enlarged unit cell of the nonvolatile memory device is shown in FIG. 1d. Referring to FIG. 1d, the unit cell will be described.

FIG. 1d is an enlarged cross-sectional view illustrating a unit cell of a nonvolatile memory device shown in FIGS. 1a, 1b and 1c.

Referring to FIG. 1d, a unit cell of a nonvolatile memory device includes a word line (WL) and cell source/drains 106c formed in the first active region 104a of both sides of the word line (WL). The word line (WL) includes a tunnel insulating layer 90, a charge storage layer 92, a blocking insulating layer 94 and a control gate electrode 96 that are sequentially stacked. The control gate electrode 96 crosses the first active region 104a and the charge storage layer 92 is interposed between the control gate electrode 96 and the first active region 104a. The tunnel insulating layer 90 is interposed between the charge storage layer 92 and the first active region 104a. The blocking insulating layer 94 is interposed between the charge storage layer 92 and the control gate electrode 96.

The charge storage layer 92 may be formed of a doped semiconductor or an undoped semiconductor. Alternatively, the charge storage layer 92 may be formed of an insulating material (ex: silicon nitride or an insulating material including nanocrystal) including a trap of a deep level. The tunnel insulating layer 90 may be formed of an oxide layer (e.g., a thermal oxide layer). The blocking insulating layer 94 may be formed of oxide-nitride-oxide (ONO). Alternatively, the blocking insulating layer 94 may include a high dielectric material (ex: an insulating metal oxide such as aluminum oxide or hafnium oxide) having a dielectric constant higher than the tunnel insulating layer 90. The control gate electrode 96 may include at least one selected from a group consisting of a doped semiconductor, a metal (ex: tungsten or molybdenum), a conductive metal nitride (ex: nitride titanium or nitride tantalum) and a metal silicide (ex: tungsten silicide, cobalt silicide or nickel silicide).

According to the nonvolatile memory device described above, the one common source 106s is formed in the second active region 104b crossing the first active regions 104a and extends along the second active region 104b. The source conductive line 112 is electrically connected to the common source 106s. The source conductive line 112 extends to be parallel to the common source 106s and is directly connected to a top surface of the common source 106s. Accordingly, a stable basic voltage can be applied through the common source 106s and the source conductive line 112. As a result, a nonvolatile memory device which is highly integrated with ease and has a superior characteristic can be embodied.

If the device isolation pattern 102 is disposed between the crossing regions 105 (that is, if the second active region 104b does not exist), a defect increasing a resistance may occur at an interface disposed between the crossing regions 105 and the device isolation pattern 102 because a conductive material used as the source conductive line 112 is poorly deposited. The defect increasing resistance may be an abnormal growth of a semiconductor, a semiconductor lack or the formation of a high resistance compound.

According to the present invention, the defect described above can be prevented by forming the common source 106s in the second active region 104b crossing the first active regions 104a. A resistivity of the common source 106s can be maintained at stable and low by electrically connecting the common source 106s to the source conductive line 112.

Next, a method of forming a nonvolatile memory device according to an embodiment of the present invention will be described with reference to the drawings.

Figure 2B:
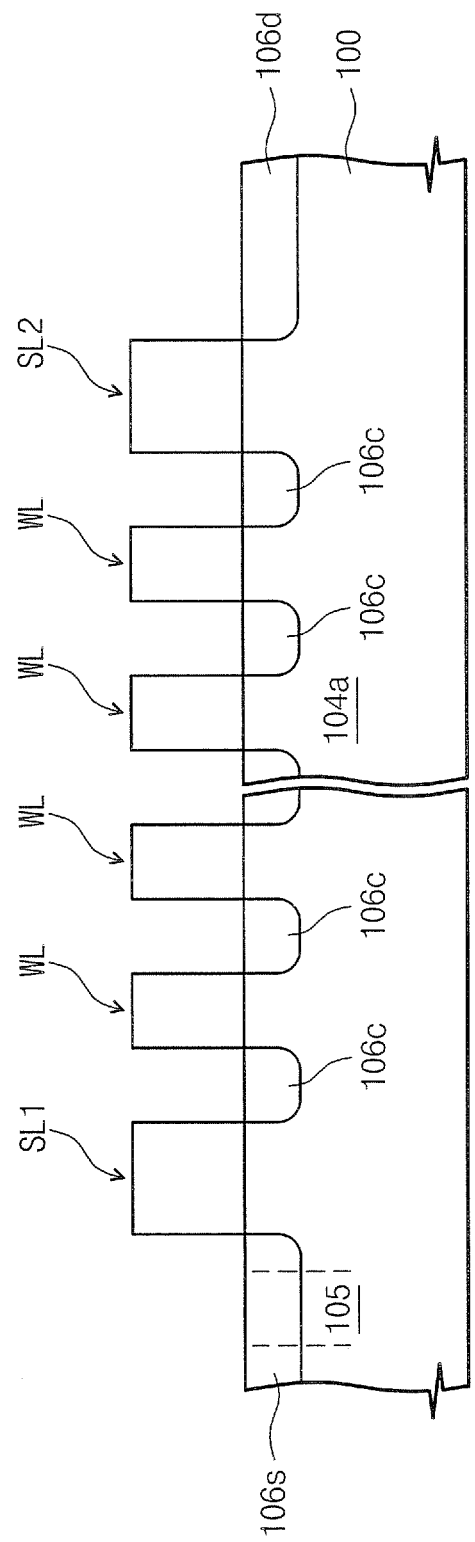
FIGS. 2b and 3b are cross-sectional views taken along the line III-III' of FIGS. 2a and 3a, respectively.
Figure 2C:
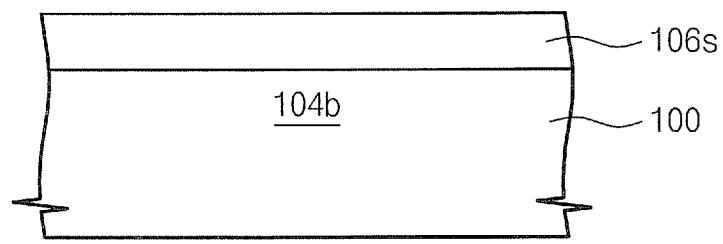
FIGS. 2c and 3c are cross-sectional views taken along the line IV-IV' of FIGS. 2a and 3a, respectively.
Figure 3A:
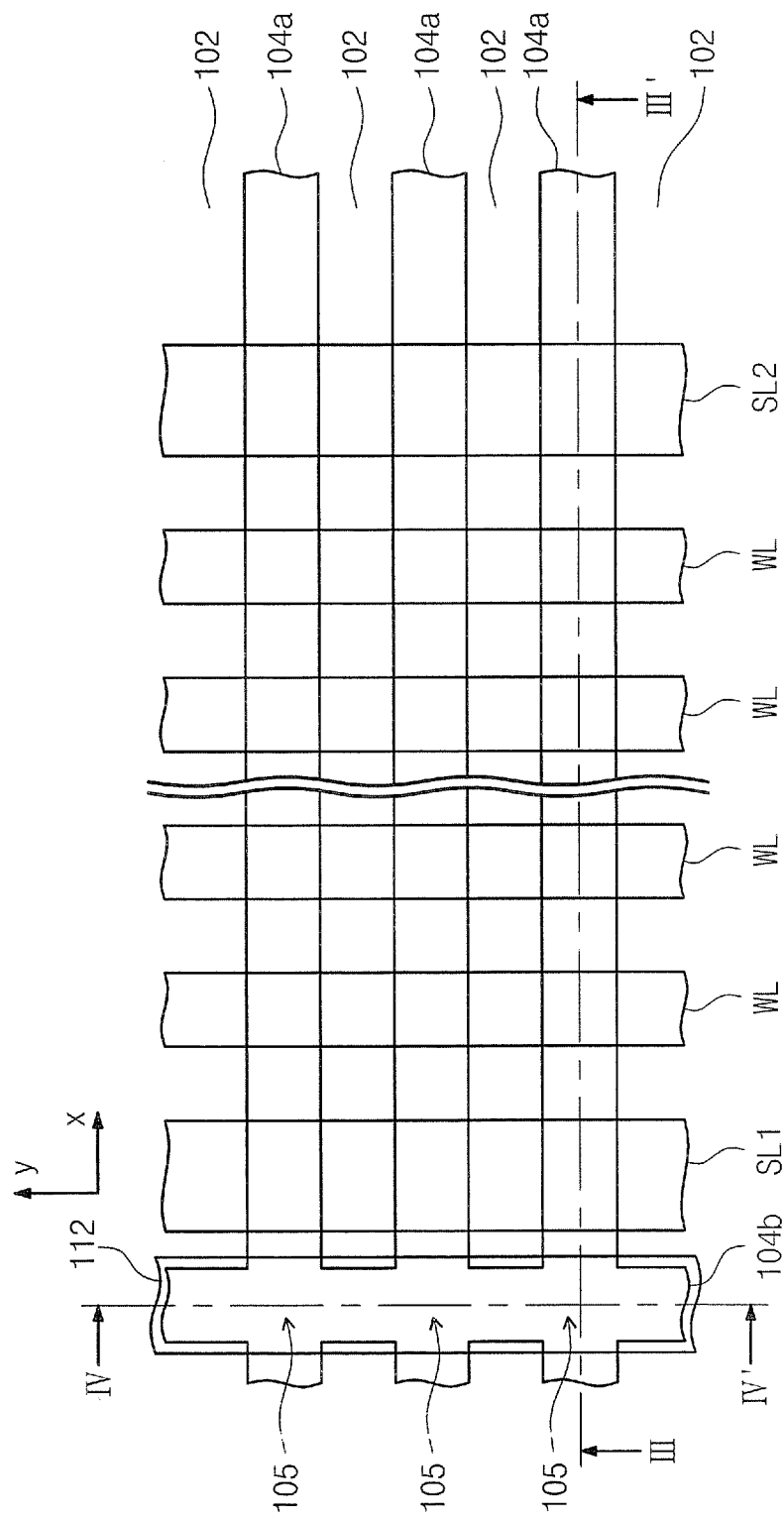
Figure 3B:
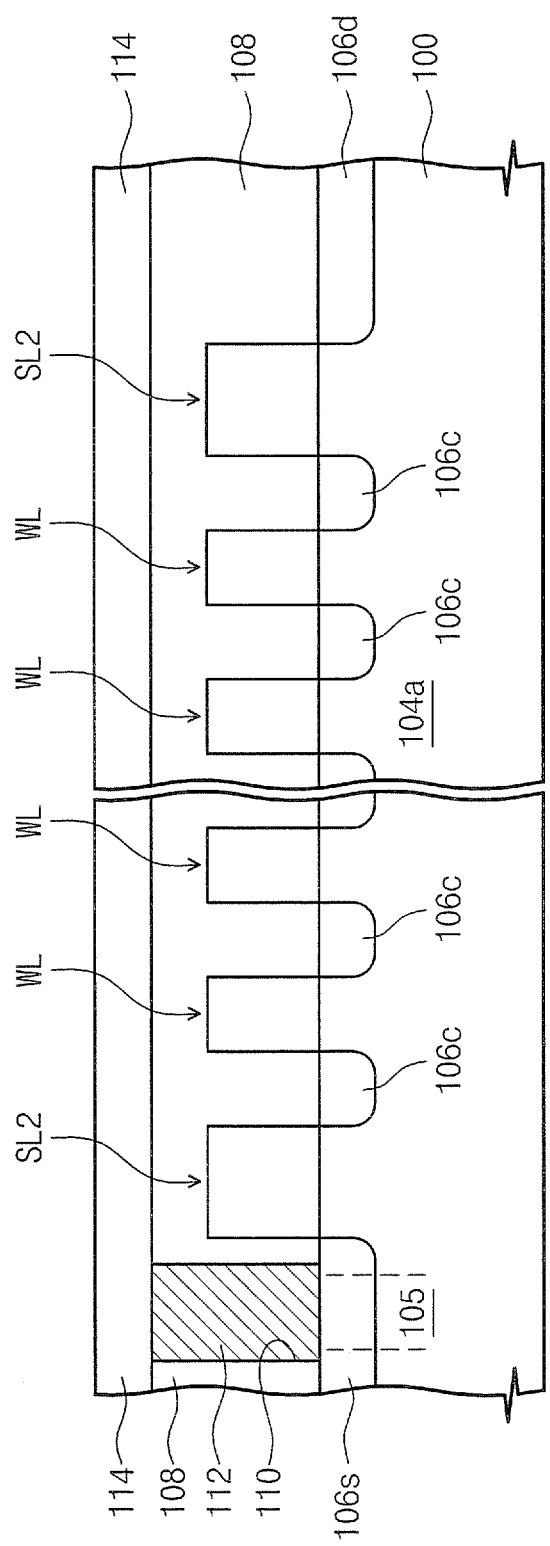
Figure 3C:
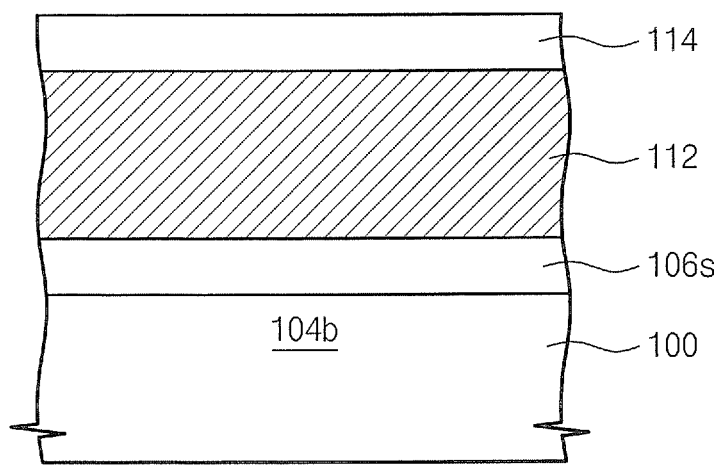

FIGS. 2a and 3a are top plan views illustrating a method of forming a nonvolatile memory device according to an embodiment of the present invention and FIGS. 2b and 3b are cross-sectional views taken along the line III-III' of FIGS. 2a and 3a, respectively. FIGS. 2c and 3c are cross-sectional views taken along the line IV-IV' of FIGS. 2a and 3a, respectively.

Referring to FIGS. 2a, 2b and 2c, a device isolation pattern 102 is formed in a substrate 100 to define first active regions 104a and a second active region 104b. The first active regions 104a are disposed in parallel to each other along a first direction and the second active region 104b extends along a second direction which is perpendicular to the first direction and crosses the first active regions 104a. The first direction corresponds to an x axis of FIG. 2a and the second direction corresponds to a y axis of FIG. 2a. In the drawings, a reference numeral "105" corresponds to a crossing region 105 where the first and second active regions 104a and 104b cross each other. The device isolation pattern 102 may be formed to be a device isolation pattern of a trench type.

A first selection line (SL1), a plurality of word lines (WL) and a second selection line (SL2) are formed to cross the first active regions 104a in parallel to each other. The lines (SL1, WL, SL2) are parallel to the second active region 104b and are formed at side of the second active region 104b. The first selection line (SL1) may be disposed to be adjacent to the second active region 104b. But, the first selection line (SL1) and the second active region 104b may be spaced apart from each other in the first direction.

Dopant ions are implanted into the first and second active regions 104a and 104b using the lines (SL1, WL, SL2) as a mask to form a common source 106s, cell sources/drains 106c and common drains 106d. The common source 106s is formed to be a line shape in the second active region 104b. The common source 106s may be formed in the active regions 104a disposed between the second active region 104b and the first selection line (SL1). The cell source/drain 106c is formed in the first active region 104a of both sides of each of the word lines (WL). The common drains 106d are formed in the first active region 104a of one side of the second selection line (SL2).

Referring to FIGS. 3a, 3b and 3c, a mold insulating layer 108 is formed on an entire surface of the substrate 100. The mold insulating layer 108 may be formed to be a single layer or a multilayer. For instance, the mold insulating layer 108 may include at least one selected from a group consisting of an oxide layer, a nitride layer, an oxynitride layer, a carbonic layer and a carbonic oxide layer. The mold insulating layer 108 is patterned to form a source groove 110 exposing the common source 106s. The source groove 110 extends along the second direction. A first conductive layer which fills the source groove 110 is formed on an entire surface of the substrate 100. The first conductive layer may be a single layer or a multilayer. The first conductive layer is planarized down to the top surface of the mold insulating layer 108 to form a source conductive line 112 in the source groove 110. a top surface of the source conductive line 112 may be coplanar with a top surfaces of the mold insulating layer 108 by the planarization process.

An insulating interlayer 114 is formed on an entire surface of the substrate 100 including the source conductive line 112. The insulating interlayer 114 may be formed to be a single layer or a multilayer. For instance, the insulating interlayer 114 may include at least one selected from a group consisting of an oxide layer, a nitride layer, an oxynitride layer, a carbonic layer and a carbonic oxide layer.

The insulating interlayer 114 and the mold insulating layer 108 are successively patterned to form bit line contact holes 116 depicted in FIGS. 1a and 1b. Subsequently, bit line plugs 118 and bit lines 120 are formed depicted in FIGS. 1b and 1c.

A method of forming the bit line plugs 118 and the bit lines 120 will be described. A second conductive layer filling the bit line contact holes 116 is formed on an entire surface of the substrate 100. The second conductive layer is planarized down to the top surface of the insulating interlayer 114 to form the bit line plugs 118. A third conductive layer of a single layer or a multilayer is formed on the insulating interlayer 118 and the third conductive layer is patterned to form the bit lines 120. In this case, an interface may exist between the respective bit lines 120 and the respective bit line plugs 118.

In the current embodiment, a source conductive line which is different from the first embodiment described above will be released.

Figure 4A:
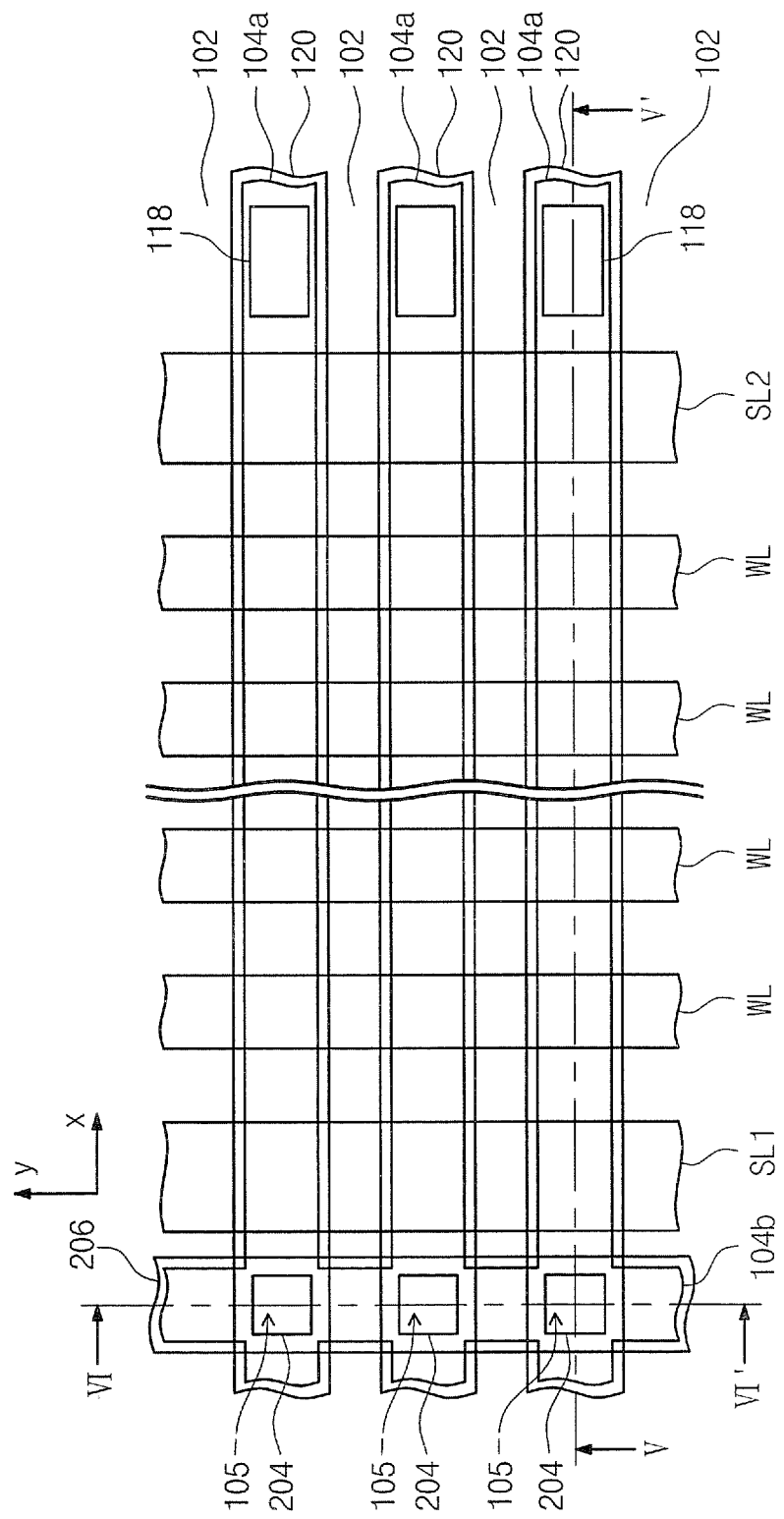
FIG. 4a is a top plan view of a nonvolatile memory device according to another embodiment of the present invention.
Figure 4B:
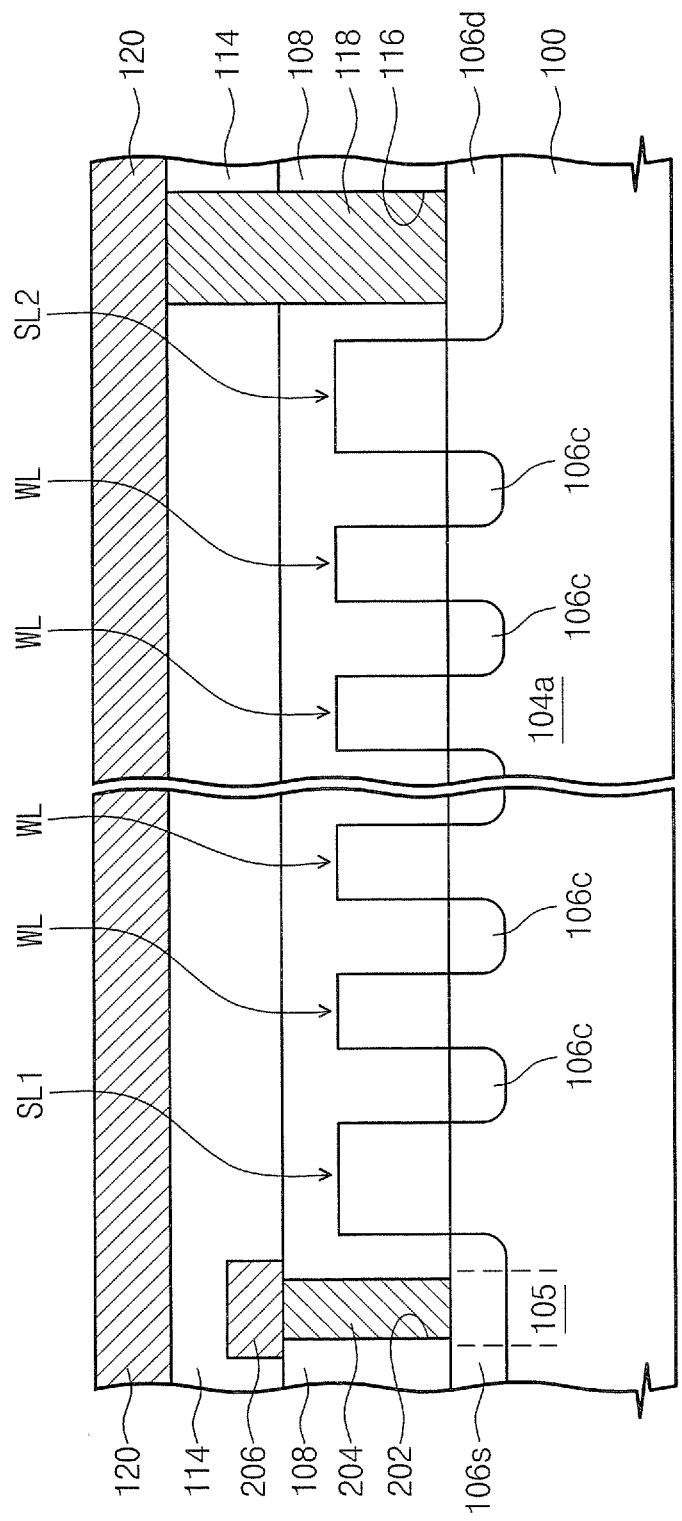
Figure 4C:
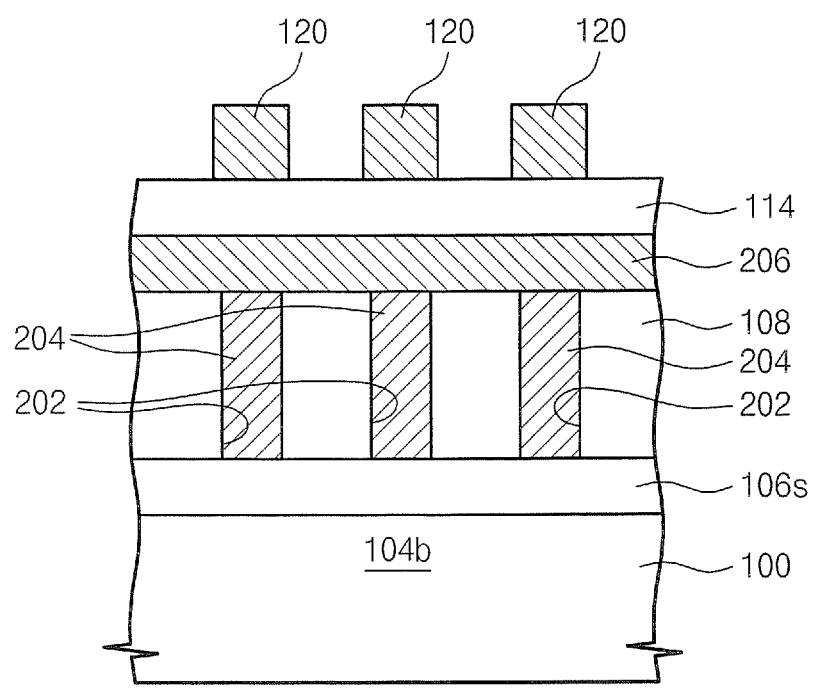

FIG. 4a is a top plan view of a nonvolatile memory device according to another embodiment of the present invention and FIG. 4b is a cross-sectional view taken along the line V-V' of FIG. 4a. FIG. 4c is a cross-sectional view taken along the line VI-VI' of FIG. 4a.

Referring to FIGS. 4a, 4b and 4c, a device isolation pattern 102 defining a plurality of first active regions 104a and a second active region 104b is disposed in a substrate 100. The first active regions 104a extend along a first direction in parallel to each other and the second active region 104b extends along a second direction and crosses the first active regions 104a.

A common source 106s is formed in the second active region 104b and extends along the second direction. A plurality of common drains 106d are formed in the first active regions 104a, respectively. A first selection line (SL1), a plurality of word lines (WL), a second selection line (SL2) cross the first active regions 104a disposed between the common source 106s and the common drains 106d. The common source 106s may extend into the first active regions 104a disposed between the second active region 104b and the first selection line (SL1).

A mold insulating layer 108 is disposed on an entire surface of the substrate 100. A source conductive line 206 is disposed on the mold insulating layer 108. The source conductive line 206 is disposed over the common source 106s. The source conductive line 206 extends in parallel to the common source 106s. A source contact plug 204 penetrates the mold insulating layer 108 to electrically connect the common source 106s and the source conductive line 206. The source contact plug 204 is in contact with a portion of the common source 106s formed in a crossing region 105 where the first and second active regions 104a and 104b cross each other. A plurality of the source contact plugs 204 may be disposed in the mold insulating layer 108. The plurality of source contact plugs 204 is disposed on the crossing regions 105, respectively. The plurality of source contact plugs 204 may be arranged in one row along the second direction. The plurality of source contact plugs 204 are connected to the source conductive line 206. The plurality of source contact plugs 204 is disposed in a plurality of source contact holes 202 penetrating the mold insulating layer 108, respectively.

The source conductive line 206 may include a conductive material having a low resistivity as compared with the common source 106s. For instance, the source conductive line 206 may include at least one selected from a group consisting of a metal (ex: titanium, tantalum, tungsten, copper, aluminum or the like), a conductive metal nitride (ex: nitride titanium or nitride tantalum) and a metal silicide (ex: tungsten silicide, titanium silicide and a doped semiconductor). In the case that the source conductive line 206 include only a doped semiconductor, a dopant concentration of the source conductive line 206 may be higher than a dopant concentration of the common source 106s. The source contact plug 204 is formed of a conductive material. For instance, the source contact plug 204 may include at least one selected from a group consisting of a metal (ex: titanium, tantalum, tungsten, copper, aluminum or the like), a conductive metal nitride (ex: nitride titanium or nitride tantalum) and a metal silicide (ex: tungsten silicide, titanium silicide and a doped semiconductor). The source conductive line 206 and the source contact plugs 204 may be formed to be one body. That is, an interface may not exist between the source conductive line 206 and the source contact plugs 204. Alternatively, an interface may exist between the source conductive line 206 and the source contact plugs 204.

An insulating interlayer 114 is disposed on the source conductive line 206 and the mold insulating layer 108. A top surface of the insulating interlayer 114 may be flat. A plurality of bit line plugs 118 fill a plurality of bit line contact holes 116 penetrating the insulating interlayer 114 and the mold insulating layer 108, respectively. The plurality of bit line plugs 118 are connected to the common drains 106d, respectively. A plurality of bit lines 120 are disposed on the insulating interlayer 114 and connected to the bit line plugs 118, respectively.

According to the nonvolatile memory device described above, one common source 106s is formed in the second active region 104b extended in the second direction. The source conductive line 206 is electrically connected to the common source 106s via the source contact plugs 204. Accordingly, a stable basic voltage can be applied to the nonvolatile memory device through the common source 106s and the source conductive line 206.

Also, even though at least one of the source contact plugs 204 has a small size to increase resistance, a stable voltage can be applied to a cell string adjacent to the source contact plug 204 having the small size. In detail, the common source 106s is connected to a plurality of the cell strings by the second active region 104b. Therefore, the cell string adjacent to the source contact plug 204 having the small size is also electrically connected to the other source contact plugs 204 at both sides of the source contact plug 204 having the small size. As a result, a stable voltage can be applied to the cell string adjacent to the source contact plug 204 having the small size.

Figure 5A:
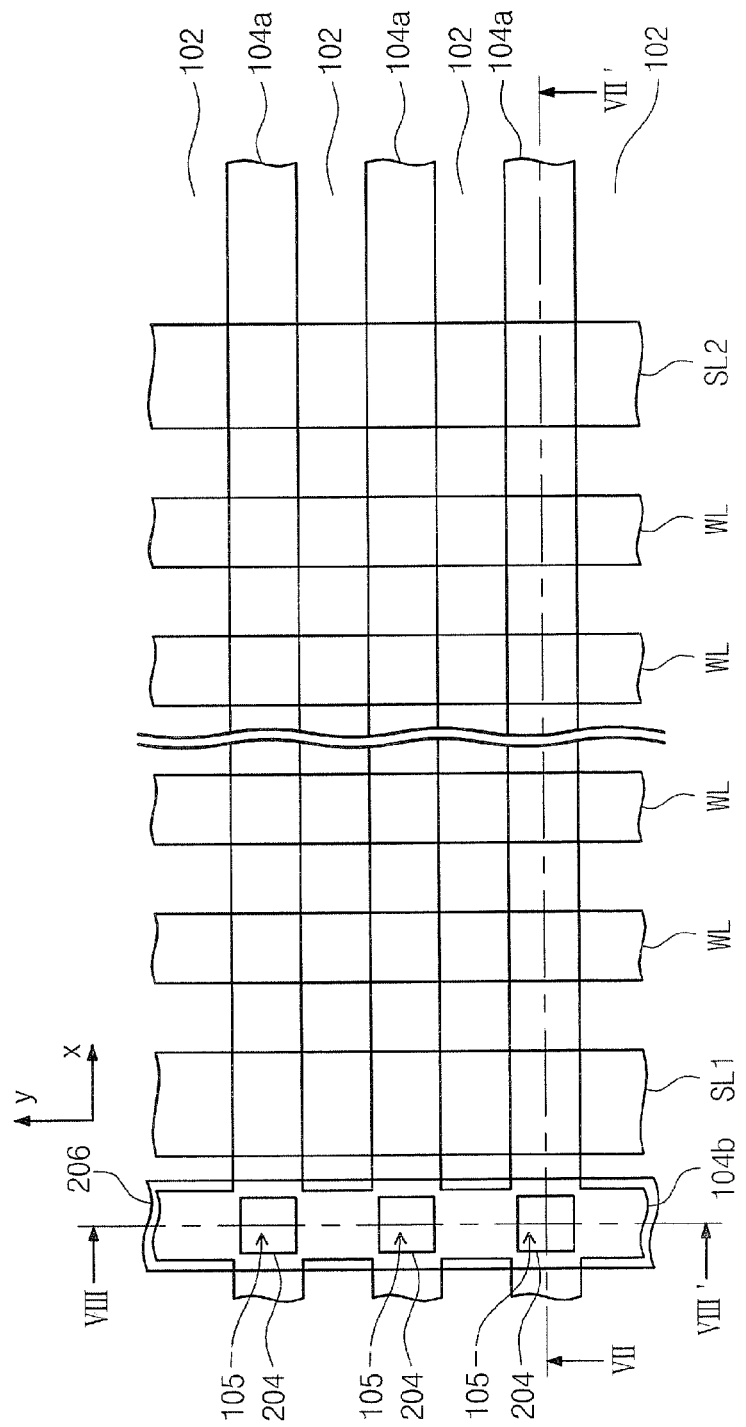
FIG. 5a is a top plan view illustrating a method of forming a nonvolatile memory device according to another embodiment of the present invention.
Figure 5B:
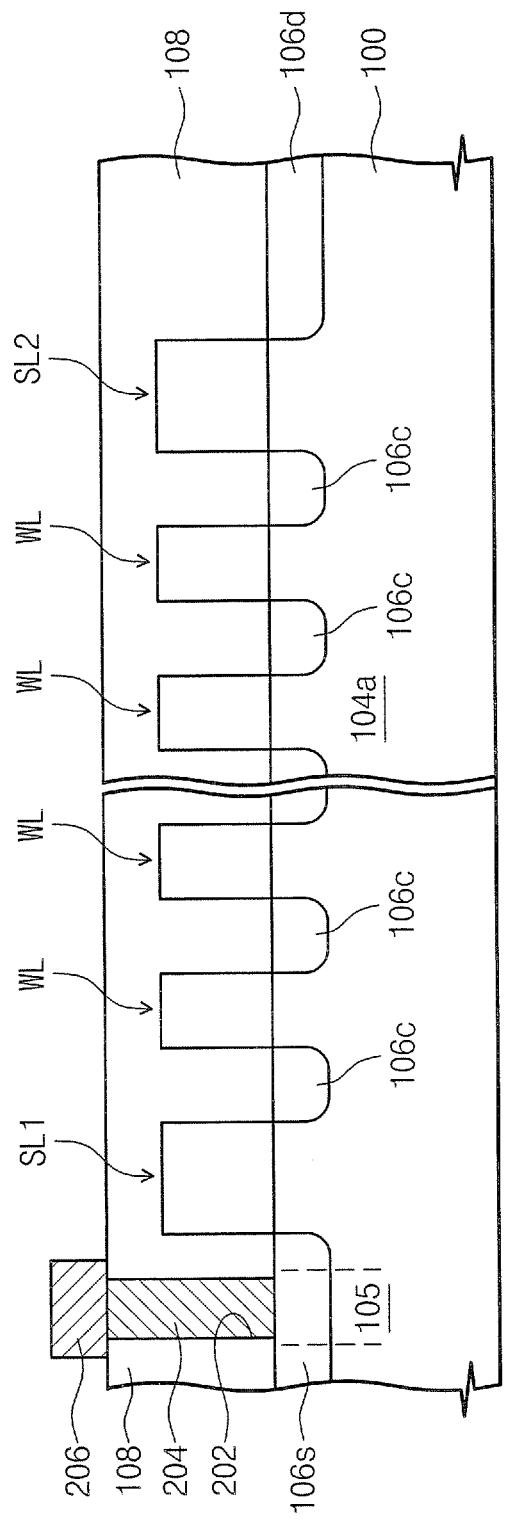
Figure 5C:
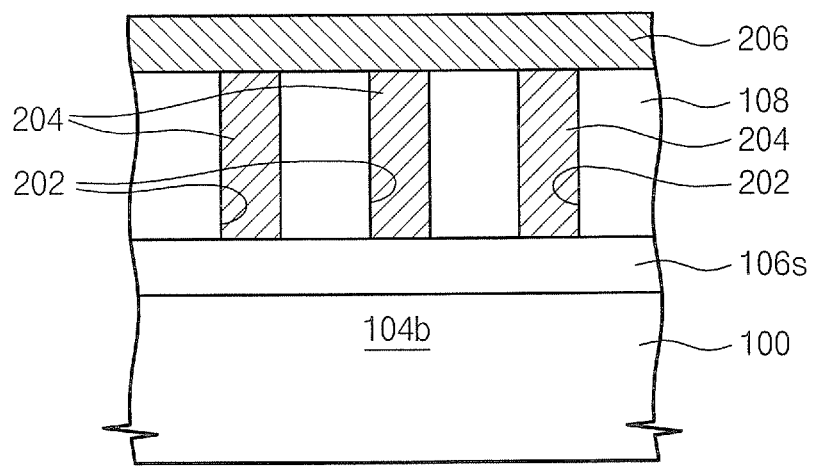

Next, a method of forming a nonvolatile memory device according to a present embodiment will be described. FIG. 5a is a top plan view illustrating a method of forming a nonvolatile memory device according to another embodiment of the present invention and FIG. 5b is a cross-sectional view taken along the line VII-VII' of FIG. 5a. FIG. 5c is a cross-sectional view taken along the line VIII-VIII' of FIG. 5a.

Referring to FIGS. 5a, 5b and 5c, methods of forming a device isolation pattern 102 defining first active regions 104a and a second active region 104b, lines (SL1, WL, SL2), a common source 106s, cell sources/drains and common drains 106d may be the same as the first embodiment described before.

A mold insulating layer 108 is formed on an entire surface of a substrate 100. The mold insulating layer 108 is patterned to form a plurality of source contact holes 202 respectively exposing crossing regions 105. The source contact holes 202 form a line along the second region 104b. The source contact holes 202 are spaced apart from each other in a second direction (i.e., y axis direction).

Subsequently, source contact plugs 204 and a source conductive line 206 are formed. The source contact plugs 204 fill the source contact holes 202, respectively. The source conductive line 206 is disposed on the mold insulating layer 108 and connected to the source contact plugs 204.

A method of forming the source contact plugs 204 and the source conductive line 206 will be described. A conductive layer filling the source contact holes 206 is formed on an entire surface of the substrate 100. The conductive layer may be a single layer or a multilayer. The conductive layer is patterned to form the source conductive line 206 on the mold insulating layer 108. Portions of the conductive layer filling the source contact holes 202 correspond to the source contact plugs 204, respectively. The source contact plugs 204 and the source conductive line 206 may be formed to be one body. That is, an interface may not exist between the source contact plugs 204 and the source conductive line 206.

Another method of forming the source contact plugs 204 and the source conductive line 206 will be described. After a first conductive layer filling the source contact holes 202 is formed on an entire surface of the substrate 100, the first conductive layer is planarized down to the top surface of the mold insulating layer 108 to form the source contact plugs 204. A second conductive layer is formed on the mold insulating layer 108 and the second conductive layer is patterned to form the source conductive line 206. In this case, an interface may exist between the source contact plugs 204 and the source conductive line 206. The first and second conductive layers may be a single layer or a multilayer.

Subsequently, the insulating interlayer 114 of FIGS. 4a, 4b and 4c is formed. After forming the insulating interlayer 114, a process of planarizing a top surface of the insulating interlayer 114 may be further performed. Methods of forming bit line plugs 118 and bit lines 120 may be the same as the first embodiment described before.

Figure 6:
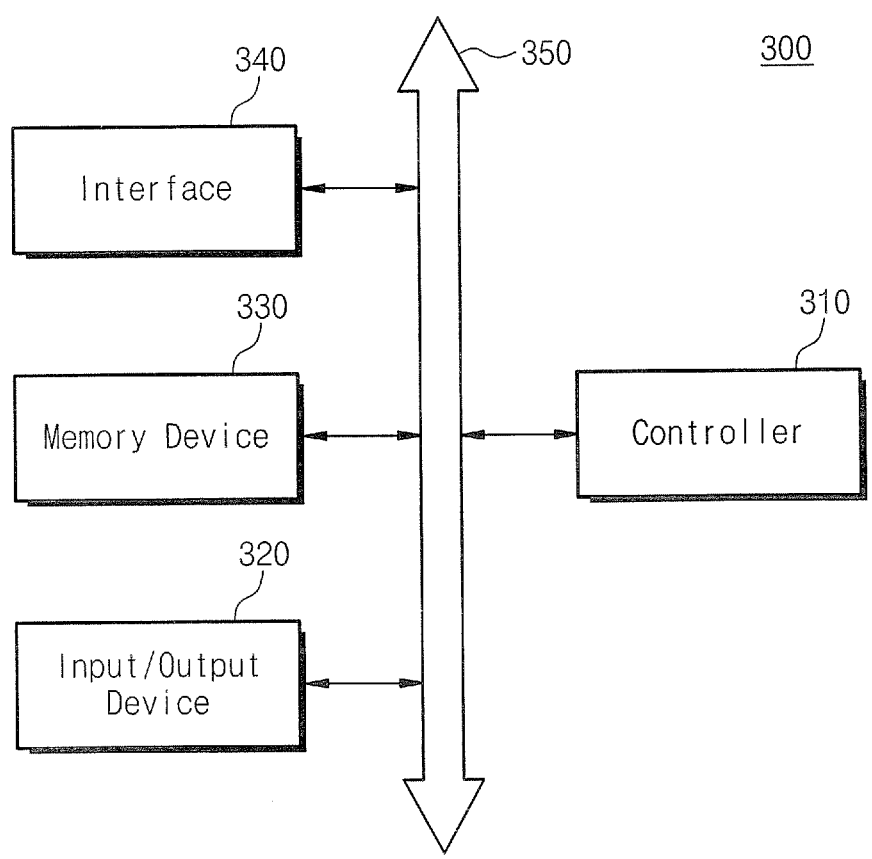
FIG. 6 is a block diagram of an electronic system according to some embodiments of the present invention.

According to an embodiment of the present invention, the nonvolatile memory device released in the first and second embodiments can constitute an electronic system. FIG. 6 is a block diagram of an electronic system according to some embodiments of the present invention.

Referring to FIG. 6, an electronic system 300 may include a controller 310, an input/output device 320 and a memory device 330. The controller 310, the input/output device 320 and the memory device 330 may be combined with each other through a bus 350. The bus 350 is a path through which data transfers. The controller 310 is at least one microprocessor and may include at least one selected from a digital signal processor, a microprocessor and logic devices performing a function similar with the digital signal processor, the microprocessor. The input/output device 320 may include at least one selected from a key pad, a key board and a display device. The memory device 330 is a device storing data. The memory device 330 can store data and/or an instruction executed by the controller 310. The memory device 330 may include at least one selected from nonvolatile memory devices released in the first and second embodiments described before. The electronic system 300 may further include an interface 340 for receiving data from a communication network or for transferring data to a communication network. The interface 340 may be a cable type or a wireless type. For instance, the interface 340 may include an antenna or a transceiver.

The electronic system 300 may be embodied with a mobile system, a personal computer, an industrial computer or a system performing a variety of functions. For instance, the mobile system may be a personal digital assistant (PDA), a portable computer, a web tablet, a wireless phone, a laptop computer, a memory card, a digital music system, an information transferring/receiving system or the like. In the case that the electronic system 300 is a equipment which can perform a wireless communication, the electronic system 300 may be used in a communication interface protocol of a third generation such as CDMA, GSM, NADC, E-TDMA, WCDMA, CDMA2000.

Figure 7:
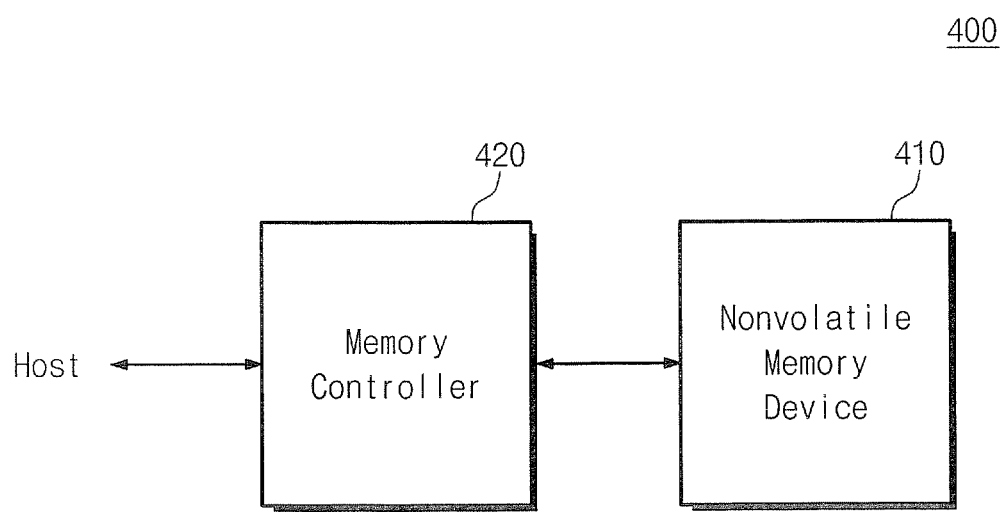
FIG. 7 is a block diagram of a memory card according to some embodiments of the present invention.

FIG. 7 is a block diagram of a memory card according to some embodiments of the present invention.

Referring to FIG. 7, a memory card 400 includes a nonvolatile memory device 410 and a memory controller 420. The nonvolatile memory device 410 can store data or decode stored data. The nonvolatile memory device 410 may include at least one selected from nonvolatile memory devices released in the first and second embodiments described before. The memory controller 420 reads stored data in response to a request of decoding/writing of a host or controls the nonvolatile memory device 410 so as to store data.

What is claimed is:
1. A nonvolatile memory device, comprising:
a device isolation pattern formed in a substrate, the device isolation pattern defining a plurality of first active regions and a second active region, wherein the plurality of first active regions extend in parallel to each other along a first direction, and wherein the second active region extends along a second direction perpendicular to the first direction and crosses the plurality of the first active regions, wherein the second active region is commonly connected to the plurality of the first active regions;
a common source formed in the second active region and extends along the second direction;
a plurality of common drains formed in the plurality of the first active regions, respectively;
a first selection line, a plurality of word lines, and a second selection line, each of the first selection line, the plurality of word lines, and the second selection line crossing the first active regions, each of the first selection line, the plurality of word lines, and the second selection line disposed between the common source and the common drains, and each of the first selection line, the plurality of word lines, and the second selection line in parallel to each other, wherein the common source has different conductive type than a channel region of one of the first selection line and the second selection line; and
a source conductive line disposed on the second active region, the source conductive line extending along the second direction and being electrically connected to the common source.

2. The nonvolatile memory device of claim 1, further comprising a mold insulating layer which covers an entire surface of the substrate and includes a source groove exposing the common source,
wherein the source conductive line is disposed in the groove and connected to the common source.

3. The nonvolatile memory device of claim 2, wherein a top surface of the source conductive line is coplanar with a top surface of the mold insulating layer.

4. The nonvolatile memory device of claim 2, further comprising:
an insulating interlayer disposed on the source conductive line and the mold insulating layer;
a plurality of bit line plugs respectively connected to the plurality of common drains by penetrating the insulating interlayer and the mold insulating layer; and
a plurality of bit lines which extend in parallel to each other along the first direction and are respectively connected to the plurality of common bit line plugs.

5. The nonvolatile memory device of claim 1, further comprising:
a mold insulating layer covering an entire surface of the substrate; and
at least one contact plug connected to the common source through the mold insulating layer,
wherein the source conductive line is disposed on the mold insulating layer and is connected to the at least one contact plug.

6. The nonvolatile memory device of claim 5, wherein the at least one contact plug is connected to the common source formed in a crossing region where the first active regions and the second active region cross each other.

7. The nonvolatile memory device of claim 6, wherein a plurality of the contact plugs are disposed in the mold insulating layer,
the plurality of contact plugs are respectively connected to portions of the common sources formed at the crossing region where the plurality of first active regions cross the second active region, and
the plurality of the contact plugs are arranged in a row along the second direction.

8. The nonvolatile memory device of claim 5, further comprising:
an insulating interlayer disposed on the source conductive line and the mold insulating layer;
a plurality of bit line plugs respectively connected to the plurality of common drains by penetrating the insulating interlayer and the mold insulating layer; and
a plurality of bit lines which extend in parallel to each other along the first direction and are respectively connected to the plurality of common bit line plugs.

9. The nonvolatile memory device of claim 1, wherein the source conductive line includes a conductive material having lower resistivity than the common source.

10. The nonvolatile memory device of claim 1, wherein the first selection line is disposed to be adjacent to the common source and the second selection line is disposed to be adjacent to the common drains.

11. The nonvolatile memory device of claim 10, wherein the first selection line is spaced apart from the second active region in the first direction and the common source extends in the first active regions disposed between the second active region and the first selection line.

12. The nonvolatile memory device of claim 1, further comprising cell source/drains formed in the first active regions of both sides of each of the word lines.

13. The nonvolatile memory device of claim 1, wherein each of the word lines comprises:
a control gate electrode crossing one of the first active regions;
a charge storage layer interposed between the control gate electrode and the one of the first active regions;
a tunnel insulating layer interposed between the charge storage layer and the one of the first active regions; and
a blocking insulating layer interposed between the charge storage layer and the control gate electrode.

14. The nonvolatile memory device of claim 1, wherein the common source is in a crossing region where the second active region crosses one of the first active regions.

15. A nonvolatile memory device, comprising:
a device isolation pattern formed in a substrate, the device isolation pattern defining a plurality of first active regions and a second active region, wherein the plurality of first active regions extend in parallel to each other along a first direction, and wherein the second active region extends along a second direction perpendicular to the first direction and is commonly connected to the plurality of first active regions;
a common source formed in the second active region and extending along the second direction;
a plurality of common drains formed in the plurality of the first active regions, respectively; and
a plurality of word lines crossing the first active regions and extending along the second direction.

16. The nonvolatile memory device of claim 15, wherein the common source and the common drains have different conductive type than the first active regions and the second active region.

17. The nonvolatile memory device of claim 15, further comprising a first selection line adjacent the common source and crossing the first active regions, and a second selection line adjacent the common drains and crossing the first active regions.

18. The nonvolatile memory device of claim 17, wherein the common source has different conductive type than a channel region of one of the first selection line and the second selection line.

19. The nonvolatile memory device of claim 17, wherein the plurality of word lines are disposed between the first selection line and the second selection line.

20. The nonvolatile memory device of claim 15, further comprising a source conductive line disposed on the second active region, the source conductive line extending along the second direction and being electrically connected to the common source.

21. The nonvolatile memory device of claim 20, wherein the source conductive line directly contacts an entire upper surface of the common source.

22. The nonvolatile memory device of claim 20, further comprising a mold insulating layer that covers an entire surface of the substrate and includes a source groove exposing the common source,
wherein the source conductive line is disposed in the source groove and connected to the common source.

23. The nonvolatile memory device of claim 20, wherein the source conductive line includes a conductive material having lower resistivity than the common source.

24. The nonvolatile memory device of claim 15, further comprising a plurality of bit lines that extend in parallel to each other along the first direction and are respectively connected to the plurality of common drains.

* * * * *